(12) United States Patent
Carta et al.

(10) Patent No.: US 10,808,316 B2
(45) Date of Patent: Oct. 20, 2020

(54) COMPOSITION CONTROL OF CHEMICAL VAPOR DEPOSITION NITROGEN DOPED GERMANIUM ANTIMONY TELLURIUM

(71) Applicants: INTERNATIONAL BUSINESS MACHINES CORPORATION, Armonk, NY (US); ULVAC, Inc., Kanagawa (JP)

(72) Inventors: Fabio Carta, Pleasantville, NY (US); Takeshi Masuda, Ossining, NY (US); Gloria W. Y. Fraczak, Queens, NY (US); Robert Bruce, White Plains, NY (US); Norma Edith Sosa, Ossining, NY (US); Matthew J. BrightSky, Pound Ridge, NY (US)

(73) Assignees: INTERNATIONAL BUSINESS MACHINES CORPORATION, Armonk, NY (US); ULVAC, INC. (JP)

( * ) Notice: Subject to any disclaimer, the term of this patent is extended or adjusted under 35 U.S.C. 154(b) by 142 days.

(21) Appl. No.: 15/976,443

(22) Filed: May 10, 2018

(65) Prior Publication Data

US 2019/0345607 A1 Nov. 14, 2019

(51) Int. Cl.
*C23C 16/455* (2006.01)
*C23C 16/30* (2006.01)
(Continued)

(52) U.S. Cl.
CPC ...... *C23C 16/45531* (2013.01); *C23C 16/305* (2013.01); *C23C 16/45553* (2013.01);
(Continued)

(58) Field of Classification Search
CPC ............ C23C 16/305; C23C 16/45531; C23C 16/45553; H01L 45/06; H01L 45/1253; H01L 45/1616
See application file for complete search history.

(56) References Cited

U.S. PATENT DOCUMENTS 5,687,112 A 11/1997 Ovshinsky
8,765,223 B2 7/2014 Xiao et al.
(Continued)

FOREIGN PATENT DOCUMENTS

CN 101101966 A 1/2008
CN 106340585 A 1/2017

OTHER PUBLICATIONS

Shchukina, E.M., et al., "Nanoencapsulation of phase change materials for advanced thermal energy storage systems". Chem. Soc. Rev., 2018, 47, 4156-4175.*
(Continued)

*Primary Examiner* — Bret P Chen

(74) *Attorney, Agent, or Firm* — Tutunjian & Bitetto, P.C.; L. Jeffrey Kelly

(57) ABSTRACT

A method of forming a phase change material is provided in which the crystalline state resistance of the material can be controlled through controlling the flow ratio of $NH_3/Ar$. The method may include providing a flow modulated chemical vapor deposition apparatus. The method may further include flowing gas precursors into the flow modulated chemical vapor deposition apparatus to provide the base material components of the phase change material. The method further includes flowing a co-reactant precursor and an inert gas into the flow modulated chemical vapor deposition, wherein adjusting ratio of the co-reactant precursor to the inert gas adjusts the crystalline state resistance of the phase change material.

16 Claims, 6 Drawing Sheets

(51) Int. Cl.
    *H01L 45/00* (2006.01)
    *G11C 13/00* (2006.01)
(52) U.S. Cl.
    CPC .......... *G11C 13/0004* (2013.01); *H01L 45/06* (2013.01); *H01L 45/1253* (2013.01); *H01L 45/1616* (2013.01); *H01L 45/1675* (2013.01); *H01L 45/1691* (2013.01)

(56) References Cited

U.S. PATENT DOCUMENTS

| | | | |
|---|---|---|---|
| 8,877,549 B2 | 11/2014 | Roeder et al. | |
| 9,190,609 B2 | 11/2015 | Zheng | |
| 2007/0160760 A1* | 7/2007 | Shin | C23C 16/305 427/255.35 |
| 2008/0075843 A1* | 3/2008 | Kuh | G11C 13/0004 427/125 |
| 2013/0078475 A1* | 3/2013 | Zheng | C01B 19/002 428/457 |
| 2013/0112933 A1* | 5/2013 | Zheng | C22C 28/00 257/3 |
| 2013/0334469 A1* | 12/2013 | Peng | C23C 14/0623 252/512 |
| 2015/0207070 A1* | 7/2015 | Song | H01L 45/06 252/62.3 V |
| 2018/0269388 A1* | 9/2018 | Song | H01L 45/06 |

OTHER PUBLICATIONS

Kim, Hee Jun, et al., "Modulated precursor flow epitaxial growth of AlN layers on native AlN substrates by metalorganic chemical vapor deposition". Appl. Phys. Lett. 93, 022103 (2008), pp. 1-3; https://doi.org/10.1063/1.2959064.*

Hamamura, Hirotaka, et al., "TiN Films Prepared by Flow Modulation Chemical Vapor Deposition using TiCl4 and NH3". Japanese Journal of Applied Physics, vol. 40, Part 1, No. 3A, pp. 1517-1521.*

Gomez, Judith C., et al., "High-Temperature Phase Change Materials (PCM) Candidates for Thermal Energy Storage (TES) Applications". NREL Milestone Report NREL/TP-5500-51446 Sep. 2011, pp. 1-36.*

Chen, W.K., et al., "Flow-Rate Modulation Epitaxy of InP by Metalorganic Chemical Vapor Deposition", Proc. SPIE 1144, 1st Intl Conf on Indium Phosphide and Related Materials for Advanced Electronic and Optical Devices, (Nov. 28, 1989); https://doi.org/10.1117/12.961990.*

Polkowski, Wojiech, et al., "Silicon as a Phase Change Material: Performance of h-BN Ceramic During Multi-Cycle Melting/Solidification of Silicon". JOM, vol. 71, No. 4, 2019, pp. 1492-1498.*

Chen, Bin, et al., "Crystallization Kinetics of GeSbTe Phase-Change Nanoparticles Resolved by Ultrafast Calorimetry". Journal of Physical Chemistry C, 2017, 121, 8569-8578.*

Burr, G.W. et al., "Phase change memory technology" Journal of Vacuum Science & Technology B, Nanotechnology and Microelectronics: Materials, Processing, Measurement, and Phenomena (Mar. 2010) pp. 223-262, vol. 28, No. 2.

Cho, S.L. et al., "Highly Scalable On-axis Confined Cell Structure for High Density PRAM beyond 256Mb" 2005 Symposium on VLSI Technology Digest of Technical Papers (Jun. 2005) pp. 96-97.

Machida, H. et al., "Chemical Vapor Deposition of GeSbTe Thin Films for Next-Generation Phase Change Memory" Japanese Journal of Applied Physics (May 2010) pp. 05FF06-1-05FF06-2, vol. 49.

Shelby, R.M. et al., "Crystallization dynamics of nitrogen-doped Ge2Sb2Te5" Journal of Applied Physics (May 2009) pp. 104902-1-104902-6, vol. 105.

* cited by examiner

COMPOSITION CONTROL OF CHEMICAL VAPOR DEPOSITION NITROGEN DOPED GERMANIUM ANTIMONY TELLURIUM

BACKGROUND

Technical Field

The present invention generally relates to methods of forming material layers composed of at least one of germanium (Ge), antimony (Sb) and tellurium (Te), and more particularly to forming nitrogen (N) doped layers composed of at least one of germanium (Ge), antimony (Sb) and tellurium (Te).

Description of the Related Art

Phase Change Memory (PCM) refers to a novel memory technology based on chalcogenide materials that undergo a phase change via a heater and are read out as "0" or "1" based on their electrical resistivity, which changes in correspondence to whether the phase change material in the cell is in the crystalline or amorphous phase. The chalcogenide materials used in PCM comprise a large number of binary, ternary, and quaternary alloys of a number of metals and metalloids.

SUMMARY

In accordance with an embodiment of the present invention, a method of forming a phase change material is provided in which the crystalline state resistance of the material can be controlled through controlling the flow ratio of $NH_3/Ar$. In some embodiments, the method may include providing a flow modulated chemical vapor deposition apparatus. The method may further include flowing gas precursors into the flow modulated chemical vapor deposition apparatus to provide the base material components of the phase change material. The method further includes flowing a co-reactant precursor and an inert gas into the flow modulated chemical vapor deposition, wherein adjusting ratio of the co-reactant precursor to the inert gas adjusts the crystalline state resistance of the phase change material.

In another embodiment, the method may include providing a flow modulated chemical vapor deposition apparatus, and flowing gas precursors into the flow modulated chemical vapor deposition apparatus to provide at least one of a germanium (Ge) content, antimony (Sb) content, and tellurium (Te) content of the phase change material. The method further includes flowing a co-reactant precursor of ammonia ($NH_3$) and an inert gas of argon (Ar) into the flow modulated chemical vapor deposition, wherein adjusting ratio of the co-reactant precursor to the inert gas adjusts the crystalline state resistance of the phase change material.

In another aspect, a method of forming a phase change memory device is provided. In one embodiment, the method begins with providing a lower electrode. A phase change material is deposited on the lower electrode. The phase change material is provided by a method in which the crystalline state resistance of the material can be controlled through controlling the flow ratio of $NH_3/Ar$. In some embodiments, the method may include providing a flow modulated chemical vapor deposition apparatus. The method may further include flowing gas precursors into the flow modulated chemical vapor deposition apparatus to provide the base material components of the phase change material. The method further includes flowing a co-reactant precursor and an inert gas into the flow modulated chemical vapor deposition, wherein adjusting ratio of the co-reactant precursor to the inert gas adjusts the crystalline state resistance of the phase change material. Forming the phase change memory device may also include forming an upper electrode on the upper surface of the phase change material.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
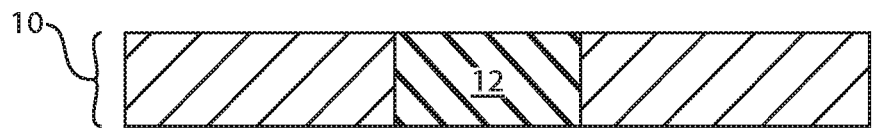
FIG. 1 is a cross sectional view of an exemplary semiconductor structure including a bottom electrode embedded in an insulating substrate in accordance with an embodiment of the present application.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Phase change memory (PCM) is a non-volatile solid-state memory technology that utilizes phase change materials having different electrical properties in their crystalline and amorphous phases. Specifically, the amorphous phase has a higher resistance than the crystalline phase. PCM cells are often programmed using heat generated by an electrical current to control the state of phase change materials. Among the main key parameter of PCM technology are: RESET current and SET speed. RESET current affects the overall power consumption of the memory array; while SET speed controls the overall speed of the memory array. In some embodiments, PCM cell have planar structure where material is deposited through physical vapor deposition (PVD) on top of a small heater/electrode which is used to switch the material. For example, the heater/electrode applies a temperature to the phase change material causes a crystalline phase conversion from an amorphous stage to a crystalline state, and vice versa. Doping the PVD material, and scaling the bottom heater/electrode help in partially decreasing the RESET current which still needs to be relatively high because of the large amount of heat that is needed to switch the material. Confined cell structure can provide for an up to 50% reduction of the RESET current when compared to planar structures, but PVD material suffers from etch damage which makes difficult their scaling for confined structures. Chemical vapor deposition (CVD) can conformally deposit material in small pores allowing for aggressively scaled confined cells without etch damage. CVD deposition can enable fabrication of PCM confined cell with aggressive aspect ratio which allows for high density array decreasing the per-bit cost of fabrication. Additional precursor can be added to dope the material. However, CVD composition control of PCM materials has proven to be more difficult as compared to material deposited through PVD.

In some embodiments, the methods and structures provided by the present disclosure can provide a high crystalline resistance fast crystallization speed nitrogen (N) doped GeSbTe material deposited by chemical vapor deposition (CVD). In some embodiments, the methods and structures that are described herein provides a method of controlling the material composition by tuning the flow ratio of two different gases, i.e., an inert carrier, e.g., argon (Ar), and a co-reactant that provide the nitrogen dopant, e.g., ammonia ($NH_3$). In some embodiments, the methods described herein can effectively increase the crystalline state resistance (which indicates a RESET current reduction) and improves the set speed of the phase change material. In some embodiments, the chemical vapor deposition (CVD) method that is employed to deposit the nitrogen (N) doped GeSbTe material is a flow-modulated CVD tool. As will be described in greater detail below, the material can be deposited on surfactant liner for resistance drift mitigation. In some embodiments, during deposition of the phase change material, e.g., nitrogen (N) doped GeSbTe material, the precursors, e.g., germanium (Ge) containing precursor, antimony (Sb) containing precursor, and tellurium (Te) containing precursor, may be alternatively flowed whit the aid of an inert gas (Ar), while at the same time flowing a co-reactant gas ammonia ($NH_3$). The reaction between the precursors gas and co-reactant gas generates the N—GeSbTe material. It has been demonstrated that by changing the flow ratio of $NH_3$/Ar, the crystalline state resistance of the deposited material may be controlled, achieving high crystalline resistance material (which indicates low RESET current) and fast SET speed. Further details of the process flow are not provided with reference to FIGS. 1-12B.

FIGS. 1-7 illustrate one embodiment of the initial structure on which the phase change material, i.e., nitrogen (N) doped GeSbTe material, is deposited. The phase change material, i.e., nitrogen (N) doped GeSbTe material, is deposited on surfactant liner for resistance drift mitigation.

Referring first to FIG. 1, there is illustrated an exemplary semiconductor structure including a bottom electrode 12 embedded in an insulating substrate 10 in accordance with an embodiment of the present application. Although a single bottom electrode 12 is described and illustrated, a plurality of bottom electrodes may be formed into the insulating substrate 10. In some embodiments of the present application (as shown), the bottom electrode 12 extends through the entirety of the insulating substrate 10. In other embodiments, the bottom electrode 12 only partially extends through the insulating substrate 10.

The insulating substrate 10 may comprise any dielectric material including for example, silicon dioxide, silicon nitride, silicon oxynitride, silsesquioxanes, or C doped oxides (i.e., organosilicates) that include atoms of Si, C and H. In some embodiments, the dielectric material that provides insulating substrate 10 is non-porous. In other embodiments, the dielectric material that provides insulating substrate 10 is porous. In some embodiments, a single dielectric material can be used as the insulating substrate 10. In another embodiment, a plurality of dielectric materials may be used as the insulating substrate 10.

The insulating substrate 10 may be formed on a base substrate not shown. The base substrate may include a semiconductor material, an insulator material, and/or conductive material. The insulating substrate 10 can be formed utilizing a deposition process including, for example, chemical vapor deposition (CVD), plasma enhanced chemical vapor deposition (PECVD), spin-on coating, evaporation or chemical solution deposition.

In some embodiments, an opening is then formed into the insulating layer 10 and then bottom electrode 12 is formed within the opening. The opening can be formed utilizing lithography and etching. After forming the opening within the insulating substrate 10, the bottom electrode 12 is formed by deposition of a conductive metallic material into the opening. The conductive metallic material that provides the bottom electrode 12 may include, but is not limited to, titanium nitride (TiN), tungsten (W), silver (Ag), gold (Au), aluminum (Al) or multilayered stacks thereof. The conductive metallic material may be formed by a deposition process such as, for example, CVD, PECVD, physical vapor deposition (PVD), sputtering, atomic layer deposition (ALD) or plating. A planarization process or an etch back process may follow the deposition of the conductive metallic material that provides the bottom electrode 12. As is shown, the bottom electrode 12 has a topmost surface that is coplanar with a topmost surface of the insulating substrate 10.

The exemplary semiconductor structure shown in FIG. 1 may also be formed by first providing the bottom electrode 12 on a surface of a base substrate (not shown) by deposition of a conductive metallic material, followed by patterning the deposited conductive metallic material by lithography and etching. The insulating substrate 10 may then be formed by deposition of a dielectric material, followed by planarization or an etch back process.

Figure 2:
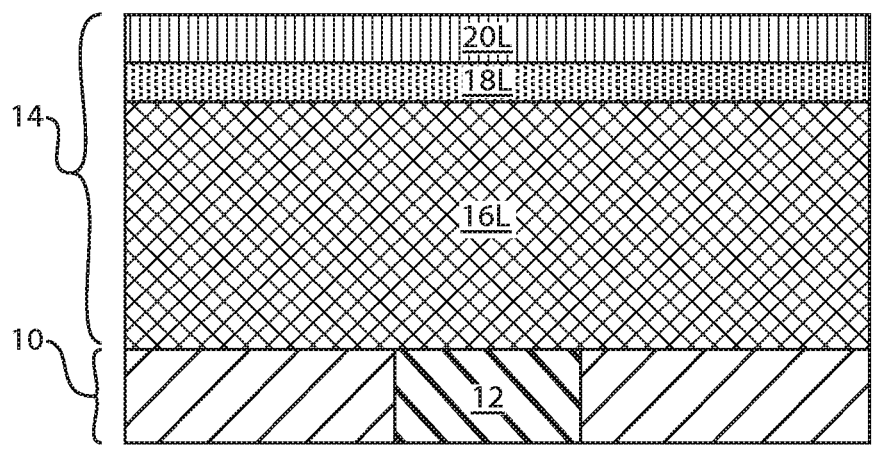
FIG. 2 is a cross sectional view of the exemplary semiconductor structure of FIG. 1 after forming a dielectric material stack of, from bottom to top, a layer of a first dielectric material, a layer of a second dielectric material and a layer of a third dielectric material in accordance with an embodiment of the present application.

Referring now to FIG. 2, there is illustrated the exemplary semiconductor structure of FIG. 1 after forming a dielectric material stack 14. The dielectric material stack 14 is formed over the insulating substrate 10 and over the bottom electrode 12. In one embodiment, the dielectric material stack 14 includes, from bottom to top, a layer of a first dielectric material 16L, a layer of a second dielectric material 18L and a layer of a third dielectric material 20L.

The layer of second dielectric material 18L may be a dielectric material that has a slower etch rate during a subsequent lateral etch than the dielectric material that provides the layer of first dielectric material 14L and the dielectric material that provides the layer of third dielectric material 20L. In one embodiment of the present application, the layer of first dielectric material 16L, and the layer of third dielectric material 20L may comprise a same dielectric material, which differs from that of dielectric material that provides the second layer of dielectric material 18L. In another embodiment of the present application, the layer of first dielectric material 16L, the layer of second dielectric material 18L and the layer of third dielectric material 20L may comprise different dielectric materials.

The dielectric material that provides the layer of first dielectric material 16L, the layer of second dielectric material 18L and the layer of third dielectric material 20L may comprise one of the dielectric materials mentioned above for the insulating substrate 10 so long as the layer of second dielectric material 18L comprises a dielectric material that has a slower etch rate during a subsequent lateral etch than the dielectric material that provides the layer of first dielectric material 14L and the dielectric material that provides the layer of third dielectric material 20L. In one example, the layer of first dielectric material 16L, and the layer of third dielectric material 20L each comprise silicon dioxide, while the layer of second dielectric material 16L may comprise silicon nitride. The dielectric material that provides the layer of first dielectric material 16L, the layer of second dielectric material 18L and the layer of third dielectric material 20L may be formed utilizing one of the deposition processes mentioned above in providing the dielectric material for insulating substrate 10.

Figure 3:
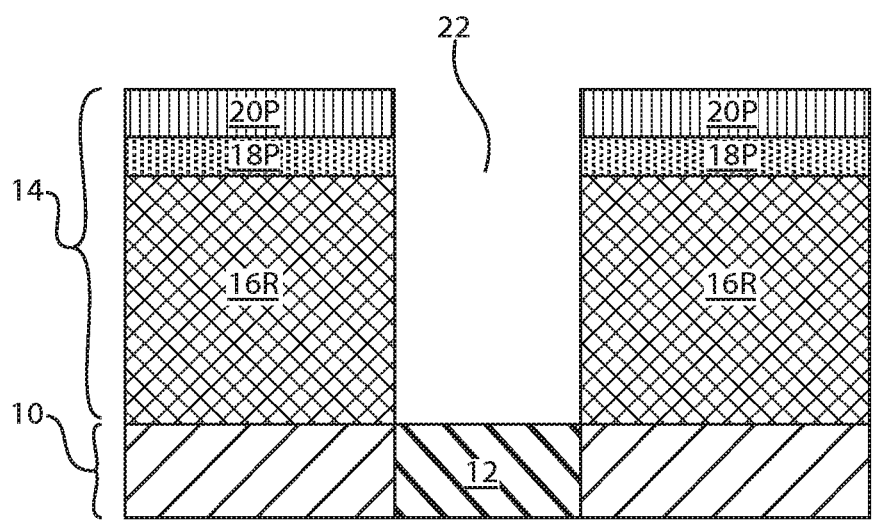
FIG. 3 is a cross sectional view of the exemplary semiconductor structure of FIG. 2 after forming a via opening within the dielectric material stack that exposes a surface of the bottom electrode embedded in the insulating substrate.

Referring now to FIG. 3, there is illustrated the exemplary semiconductor structure of FIG. 2 after forming a via opening 22 within the dielectric material stack 14 that exposes a surface of the bottom electrode 12 embedded in the insulating substrate 10. The via opening 22 can be formed by patterning the dielectric material stack 14. In one embodiment, the dielectric material stack 14 can be patterned by lithography and etching. In another embodiment, the dielectric material stack 14 may be patterned utilizing a sidewall image transfer process. After patterning the dielectric material stack 14, portions of the layer of the first dielectric material 16L, portions of the layer of second dielectric material 18L and portions of the layer of third dielectric material 20L remain. The remaining portions of the layer of the first dielectric material 16L may be referred to herein as first dielectric material portions 16P, the remaining portions of the layer of second dielectric material 18L may be referred to herein as second dielectric material portions 18P, and the remaining portions of the layer of third dielectric material 20L may be referred to herein as third dielectric material portions 20P.

Figure 4:
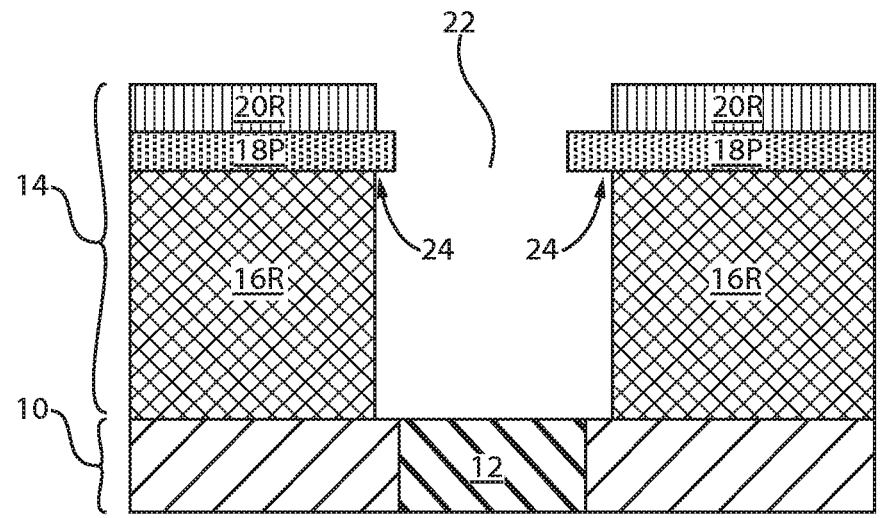
FIG. 4 is a cross sectional view of the exemplary semiconductor structure of FIG. 3 after performing a lateral etch of remaining portions of the layer of first dielectric material and remaining portions of the layer of third dielectric material.

Referring now to FIG. 4, there is illustrated the exemplary semiconductor structure of FIG. 3 after performing a lateral etch of the remaining portions of the layer of first dielectric material (i.e., first dielectric material portions 16P) and the remaining portions of the layer of third dielectric material (i.e., third dielectric material portions 20P). An overhang region 24 is created beneath a protruding portion of the second dielectric material portions 18P. The first dielectric material portions 16P that remain after the lateral etch can be referred to as reduced length first dielectric material portions 16R, while the third dielectric material portions 20P that remain after the lateral etch can be referred to as reduced length third dielectric material portions 20R. In some embodiments, and when the layers of the first and third dielectric materials comprise a same dielectric material. The reduced length first dielectric material portions 16R has a sidewall surface (or edge) that is vertical aligned, i.e., vertical coincident, to a sidewall surface (or edge) of the reduced length third dielectric material portions 20R.

Figure 5:
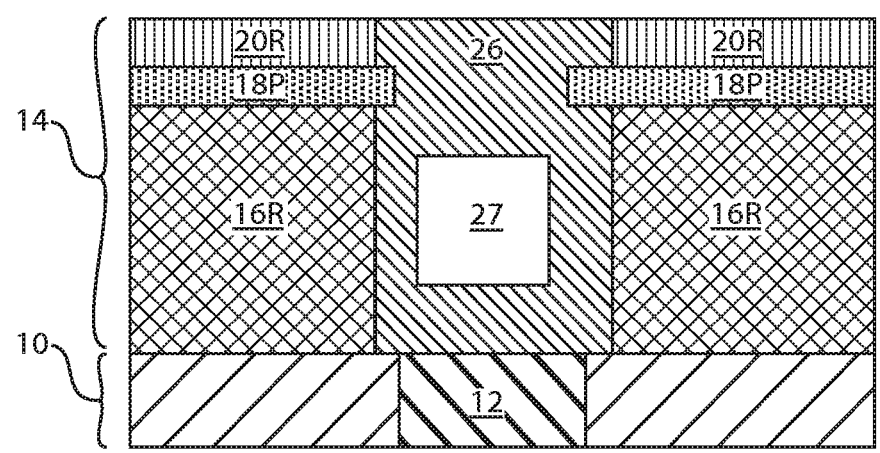
FIG. 5 is a cross sectional view of the exemplary semiconductor structure of FIG. 4 after formation of metal nitride keyhole forming material within the via opening and having a topmost surface that is coplanar with a topmost surface of each remaining portion of the layer of third dielectric material.

Referring now to FIG. 5, there is illustrated the exemplary semiconductor structure of FIG. 4 after formation of metal nitride keyhole forming material 26 within the via opening 22 and having a topmost surface that is coplanar with a topmost surface of each remaining portion of the layer of third dielectric material (i.e., the reduced length third dielectric material portions 20R). As is shown, a void (or keyhole) 27 is provided within a portion of the via opening 22. The metal nitride keyhole forming material 26 and the keyhole 27 can be first formed by deposition of a conformal metal nitride material. The deposition of the conformal metal nitride material that provides the metal nitride keyhole forming material 26 may include CVD or PECVD. The conformal metal nitride material that provides the metal nitride keyhole forming material 26 comprises a compound of the formula M-X—N wherein M is Ti or Ta, and X is Al or Si. In some embodiments, the metal nitride may be composed of titanium nitride or tantalum nitride.

Following deposition of the conformal metal nitride material that provides the metal nitride keyhole forming material 26, the conformal metal nitride material is planarized to provide the structure shown in FIG. 5. Planarization, which removes any conformal metal nitride from atop the reduced length third dielectric material portions 20R, may include chemical mechanical planarization (CMP) and/or grinding.

Figure 6:
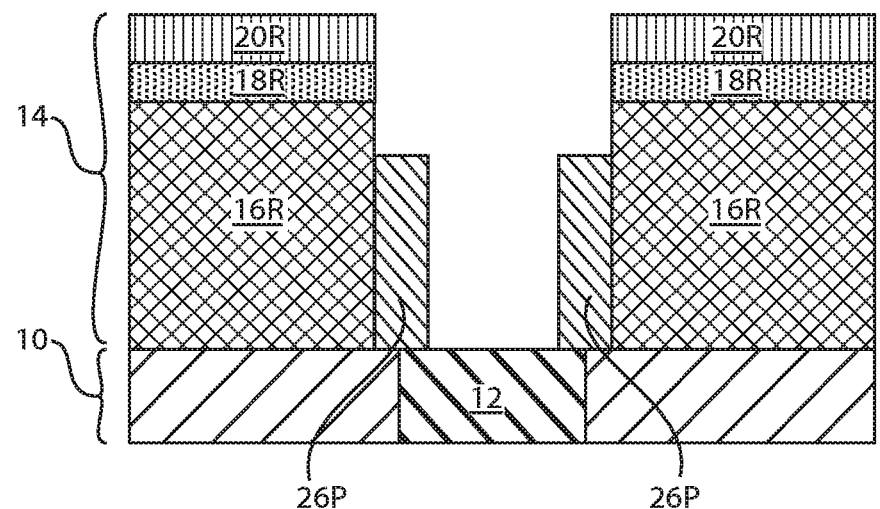
FIG. 6 is a cross sectional view of the exemplary semiconductor structure of FIG. 5 after removing an upper portion of the metal nitride keyhole forming material and a protruding portion of the layer of second dielectric material within the via opening.

Referring now to FIG. 6, there is illustrated the exemplary semiconductor structure of FIG. 5 after removing an upper portion of the metal nitride keyhole forming material 26 and the protruding portion of the layer of second dielectric material (i.e., a protruding portion of each second dielectric material portion 18P) within the via opening 22. The removal of the upper portion of the metal nitride keyhole forming material 26 and a protruding portion of the layer of second dielectric material may be performed by an etch such as, for example, RIE. After etching, the remaining metal nitride keyhole forming material 26 may be referred to as a metal nitride spacer 26P. As is shown, the metal nitride spacer 26P has a sidewall surface that is located on a sidewall of each reduced length first dielectric material portion 16R. The height of each metal nitride spacer 26P is below the topmost surface of each reduced length first dielectric material portion 16R. Thus, an upper sidewall surface of each reduced length first dielectric material portion 16R within the via opening 22 is not covered by a metal nitride spacer 26P.

At this point of the present application, the via opening 22 has an upper portion (located above each metal nitride spacer 26P) that has a width that is greater than a width of a lower portion of the via opening 22 that is located between each metal nitride spacer 26P. The via opening 22 is now T-shaped. Also, each metal nitride spacer 26P includes a bottommost surface that has a first portion located on a topmost surface of the insulator substrate 10 and a second portion that extends onto a surface of the bottom electrode 12.

Figure 7:
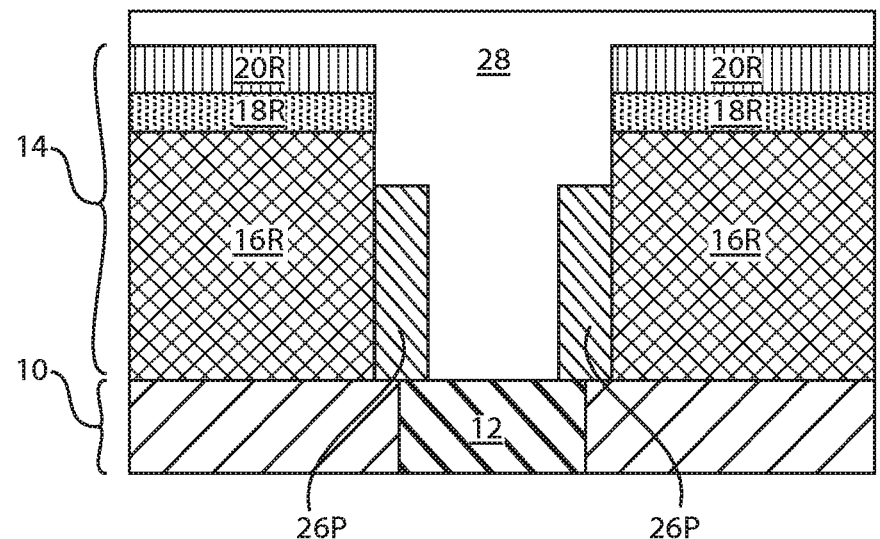
FIG. 7 is a cross sectional view of the exemplary semiconductor structure of FIG. 6 after filling a remaining volume of the via opening with a phase change material.

Referring now to FIG. 7, there is illustrated the exemplary semiconductor structure of FIG. 6 after filling a remaining volume of the via opening 22 with a phase change material 28, e.g., nitrogen (N) doped GeSbTe (GST). As is shown, the phase change material 28 is formed on exposed sidewall surfaces of the reduced length first dielectric material portions 16R, the reduced length second dielectric material portions 18R and the reduced length third dielectric material portions 20R, and exposed sidewalls and a topmost surface of each metal nitride spacer 26P. As is further shown, the phase change material 28 is formed on a portion of the surface of the bottom electrode 12 that is not covered by the metal nitride spacer 26P as well as a topmost surface of the reduced length third dielectric material portion 20R.

The methods and structures disclosed herein provide phase change material 28 that is a high crystalline resistance fast crystallization speed material, e.g., nitrogen (N) doped GeSbTe (GST), that can be deposited by chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In some embodiments, the material is deposited using a flow modulated CVD tool. By "flow modulated" it is meant that the CVD apparatus, also referred to as tool, allows for pulsing of precursors. For example, the precursor gasses that provide the germanium (Ge) content, the antimony (Sb) content and the tellurium (Te) content may be pulsed during the deposition process, whereas an inert gas, e.g., argon (Ar) gas, and a gas source that provides the nitrogen (N) dopant may be continuously flowed. In some embodiments, using the flow modulated CVD apparatus, the methods described herein for forming the phase change material 28, e.g., high crystalline resistance fast crystallization speed material, e.g., nitrogen (N) doped GeSbTe, provide a way of controlling the material composition by tuning the flow ratio of two different gases (inert/co-reactant). The material deposited has an increased crystalline state resistance (which indicates RESET current reduction) and improved set speed of the phase change material 28.

In some embodiments, the material, e.g., nitrogen (N) doped GeSbTe (GST), is deposited by flowing alternatively three different precursors (Ge,Sb,Te) while inert, e.g., argon (Ar), and reactant gas, e.g., ($NH_3$), are flowing. In addition to argon (Ar), the inert gas of the modulated CVD process may also be provided by helium (He), neon (Ne), krypton (Kr), xenon (Xe), radon (Rn), and combinations thereof. The co-reactant that is flowed with the sources for the germanium (Ge), antimony (Sb) and tellurium (Te) can be a nitrogen doping source. In some embodiments, the co-reactant that provides the nitrogen (N) source may be an ammonium gas ($NH_3$). In some other embodiments, the co-reactant that provides the nitrogen (N) source may be nitrogen gas ($N_2$).

The precursor gasses that provide the source for germanium (Ge), antimony (Sb) and tellurium (Te) may be one of chalcogenide metal and metal alloy precursors. In some examples, the chalcogenide metal and metal alloy precursors that are advantageously used for forming PCM films and devices include:

(i) butyl- and propyl-substituted alkyl hydrides of the formula $R_xMH_{y-x}$ wherein: R is butyl or propyl, with R preferably being t-butyl or isopropyl; M is a metal having an oxidation state y, e.g., Ge, Sb or Te; x>1; and (y-x) may have a zero value;

(ii) butyl- and propyl-substituted alkyl halides of the formula $R_xMH_{y-x}$ wherein: R is butyl or propyl, with R preferably being t-butyl or isopropyl; X is F, Cl, or Br; M is a metal having an oxidation state y, e.g., Ge, Sb or Te; x>1; and (y-x) may have a zero value;

(iii) digermanes of the formula $Ge_2(R^1)_6$ wherein the $R^1$ substituents are the same as or different from one another, and each $R^1$ independently selected from among H, $C_1$-$C_8$ alkyl, $C_1$-$C_8$ fluroalkyl, $C_6$-$C_{12}$ aryl, $C_6$-$C_{12}$ fluoroaryl, $C_3$-$C_8$ cycloalkyl, and $C_3$-$C_8$ cyclo-fluoroalkyl, with illustrative digermanes including $Ge_2H_6$, $Ge_2Me_6$, $Ge_2Et_6$, $Ge_2iPr_6$, $Ge_2tBu_6$, $Ge_2(SiMe_3)_6$ and $Ge_2Ph_6$, wherein Me=methyl, Et=ethyl, iPr=isopropyl, Bu=butyl and Ph=phenyl;

(iv) digermanes of the formula $Ge_2(R^1)_4$ wherein the $R^1$ substituents are the same as or different from one another, and each $R^1$ is independently selected from among H, $C_1$-$C_8$ alkyl, $C_1$-$C_8$ fluroalkyl, $C_6$-$C_{12}$ aryl, $C_6$-$C_{12}$ fluoroaryl, $C_3$-$C_8$ cycloalkyl, and $C_3$-$C_8$ cyclo-fluoroalkyl, with illustrative digermanes including $Ge_2Ph$, wherein Ph=phenyl;

(v) ring compounds including Ge as a ring constituent, e.g., five-member ring compounds;

(vi) Ge(II) compounds of the formula Ge(Cp($R^2$)$_5$)$_2$ wherein Cp is cyclopentadienyl having $R^2$ substituents on the cyclopentadienyl ring carbon atoms, wherein the $R^2$ substituents are the same as or different from one another, and each $R^2$ is independently selected from among H, $C_1$-$C_8$ alkyl, $C_1$-$C_8$ fluoroalkyl, $C_1$-$C_8$ alkylamino, $C_6$-$C_{12}$ aryl, $C_6$-$C_{12}$ fluoroaryl, $C_3$-$C_8$ cycloalkyl, and $C_3$-$C_8$ cyclo-fluoroalkyl;

(vii) Ge(II) compounds of the formula Ge($R^3$)$_2$, wherein the $R^3$ substituents are the same as or different from one another, and each $R^3$ is independently selected from among silyl, silylalkyl and substituted silylalkyl, e.g., wherein each $R^3$ is —CH(SiMe$_3$)$_2$;

(viii) Sb compounds of the formula Sb($R^4$)$_3$ wherein $R^4$ is phenyl, or substituted phenyl whose substituent(s) on the phenyl ring are independently selected from among H, $C_1$-$C_8$ alkyl, and $C_1$-$C_8$ fluroalkyl;

(ix) Sb and Te analogs of germanium compounds (iii), (iv), (v), (vi), and (vii); (x) Ge and Te analogs of antimony compounds (viii); and (xi) GeI$_4$, SbI$_3$ and TeI$_2$.

It will be appreciated that the component metal species may have different oxidation states in the various abovementioned compounds. The above listing of precursors, in reference to the digermanes, germane ring compounds and Ge(II) compounds identified above, may further include corresponding analogs wherein Ge is replaced by Sb or Te. Likewise, the above listing of precursors, in reference to the Sb compounds identified above, may further include corresponding analogs wherein Sb is replaced by Ge or Te.

In some embodiments, by tuning the flow ratio of two different gases (inert/co-reactant) without the addition of other precursors or changing the precursors pulses the modulated flow CVD method can control the electrical properties and stoichiometry of the deposited film, i.e., the phase change material 28, e.g., nitrogen (N) doped GeSbTe (GST). In some embodiments, during the CVD deposition the flow of the precursors for germanium (Ge), antimony (Sb) and tellurium (Te) may be alternated the aid of an inert gas (Ar) while at the same time flowing a co-reactant gas NH$_3$. Reaction between the precursors gas, e.g., precursors for germanium (Ge), antimony (Sb) and tellurium (Te), and the co-reactant gas, e.g., ammonia (NH$_3$) generates the N—GeSbTe material. In some embodiments, the method provides that by changing the flow ratio of NH$_3$/Ar, the crystalline state resistance can be controlled to achieve high crystalline resistance material (which indicates low RESET current) and fast SET speed.

In some examples, the time pulse for the alternating precursors that provide the germanium (Ge), antimony (Sb) and tellurium (Te) content of the phase change material 28 may include a germanium (Ge) precursor pulse of 15 seconds or less, an antimony (Sb) precursor gas pulse of 5 seconds or less, and a tellurium (Te) precursor gas pulse of 5 seconds or less. It is noted that the above example is provided for illustrative purposes only, and is not intended to limit the present disclosure, as other examples may be equally applicable. For example, the pulse time for the germanium (Ge) providing precursor may be equal to 1 second, 2 seconds, 5 seconds, 10 seconds, seconds and 20 seconds, as well as any range of values including one of the aforementioned examples as a lower limit to the range, and one of the aforementioned examples as an upper limit to the range. Further, the pulse time for germanium (Ge) may be equal to any value within the aforementioned ranges. In some examples, the pulse time for the antimony (Sb) providing precursor may be equal to 1 second, 2 seconds, 3 seconds, 4 seconds, 5 seconds, 6 seconds, and 7 seconds, as well as any range of values including one of the aforementioned examples as a lower limit to the range, and one of the aforementioned examples as an upper limit to the range. Further, the pulse time for antimony (Sb) may be equal to any value within the aforementioned ranges. In some examples, the pulse time for the tellurium (Te) providing precursor may be equal to 1 second, 2 seconds, 3 seconds, 4 seconds, 5 seconds, 6 seconds, 7 seconds, 8 seconds, 9 seconds and 10 seconds, as well as any range of values including one of the aforementioned examples as a lower limit to the range, and one of the aforementioned examples as an upper limit to the range. Further, the pulse time for tellurium (Te) may be equal to any value within the aforementioned ranges. The pulse sequence for the precursor gases may be in the following order: 1) germanium (Ge), 2) antimony (Sb), and 3) tellurium (Te).

In some embodiments, the method provides that by changing the flow ratio of NH$_3$/Ar, the crystalline state resistance can be controlled to achieve high crystalline resistance material (which indicates low RESET current) and fast SET speed. In some embodiments, the NH$_3$/Ar flow rate ranges from 0.10 to 0.01. It is noted that the above example is provided for illustrative purposes only, and is not intended to limit the present disclosure, as other examples may be equally applicable. For example, the NH$_3$/Ar flow rate may be equal to 0.10, 0.9, 0.08, 0.07, 0.06, 0.05, 0.04, 0.03, 0.02, and 0.01, as well as any range of values including one of the aforementioned examples as a lower limit to the range, and one of the aforementioned examples as an upper limit to the range. Further, the NH$_3$/Ar flow rate may be equal to any value within the aforementioned ranges. In one example the NH$_3$/Ar flow rate is between 0.09 to 0.02.

In one example, the total flow rate is less than 750 sccm, e.g., 600 sccm, but other flow rates have been contemplated, such as lower flow rates as low as 300 sccm. The chamber deposition pressure during the CVD process that deposits the phase change material 28, e.g., nitrogen (N) doped GeSbTe (GST), my range from 2 Torr to 10 Torr. In one example, the chamber deposition pressure during the CVD process that deposits the phase change material 28, e.g., nitrogen (N) doped GeSbTe (GST), my range from 3 Torr to 7 Torr.

The temperature of the CVD process that provides the phase change material 28, e.g., nitrogen (N) doped GeSbTe (GST), may be less than 350° C. For example, the temperature of the CVD process that provides the phase change material 28, e.g., nitrogen (N) doped GeSbTe (GST) may range from 25° C. to 275° C. It is noted that the above example is provided for illustrative purposes only, and is not intended to limit the present disclosure, as other examples may be equally applicable. For example, the temperature of the CVD process for forming the phase change material 28 may be equal to 25° C., 50° C., 100° C., 150° C., 200° C., 250° C., 300° C. and 350° C., as well as any range of values including one of the aforementioned examples as a lower limit to the range, and one of the aforementioned examples as an upper limit to the range. Further, the temperature of the CVD process rate may be equal to any value within the aforementioned ranges.

The material composition of the phase change material 28, e.g., nitrogen (N) doped GeSbTe (GST) deposited by the above described CVD deposition process may include:
2 at. %<Ge<at. 10%;
30 at. %<Sb<at. 50%;
15 at. %<Te<at. 40%; and
10 at. %<N<at. 40%.

In one example, the material composition of the phase change material 28, e.g., nitrogen (N) doped GeSbTe (GST) deposited by the above described CVD deposition process may include:

4.87 at. %<Ge<at. 5.38%;
39.3 at. %<Sb<at. 42.2%;
21.1 at. %<Te<at. 39.2%; and
16.6 at. %<N<at. 31.3%.

In some embodiments, the method provides that by changing the flow ratio of $NH_3/Ar$, the crystalline state resistance can be controlled to achieve high crystalline resistance material (which indicates low RESET current) and fast SET speed.

In some embodiments, the crystalline resistance of the phase change material 28 is between 0.0041 Ohm·cm and 4.994 Ohm·cm. It is noted that this example is provide for illustrative purposes only, and is not intended to limit the present disclosure, as other examples may be equally applicable. For example, the crystalline resistance of the phase change material 28 may be equal to 0.0035 Ohm·cm, 0.0040 Ohm·cm, 0.0050 Ohm·cm, 0.010 Ohm·cm, 0.015 Ohm·cm, 0.020 Ohm·cm, 0.025 Ohm·cm, 0.030 Ohm·cm, 0.035 Ohm·cm, 0.040 Ohm·cm, 0.050 Ohm·cm, 0.50 Ohm·cm, 1.0 Ohm·cm, 1.5 Ohm·cm, 2.0 Ohm·cm, 2.5 Ohm·cm, 3.0 Ohm·cm, 4.0 Ohm·cm, 4.5 Ohm·cm, 4.75 Ohm·cm, 5.0 Ohm·cm and 5.5 Ohm·cm, as well as any range of values including one of the aforementioned examples as a lower limit to the range, and one of the aforementioned examples as an upper limit to the range. Further, the crystalline resistance of the phase change material 28 may be equal to any value within the aforementioned ranges.

Figure 9:
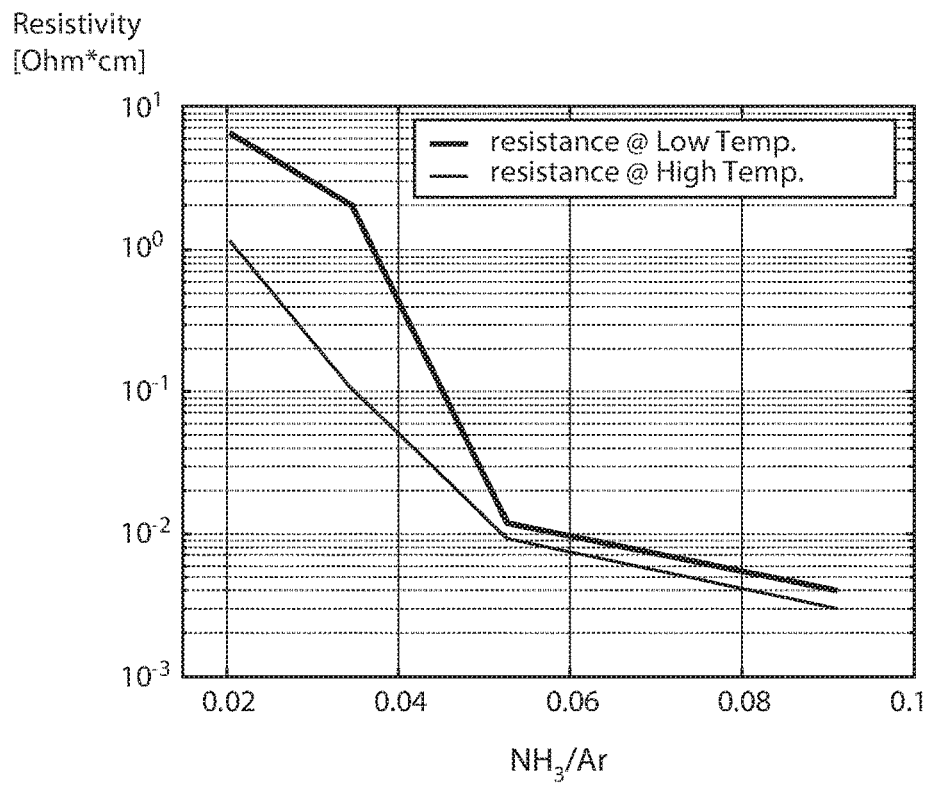
FIG. 9 is a plot of resistivity as a function of temperature for a plurality of phase change materials deposited with different rates of $NH_3/Ar$ flow, in which with increased $NH_3$ flow there is an increase in nitrogen in the phase change material, a decrease in germanium and tellurium in the phase change material, and a decrease in crystalline resistance.

FIG. 9 is a plot of resistivity as a function of temperature for a plurality of phase change materials deposited with different rates of $NH_3/Ar$ flow, in which with increased $NH_3$ flow relative to a constant total $Ar+NH_3$ flow there is an increase in nitrogen in the phase change material, a decrease in germanium and tellurium in the phase change material, and a decrease in crystalline resistance.

In some embodiments, the crystallization speed of the phase change material 28 is between 330 nanoseconds (ns) and 85 nanoseconds (ns). It is noted that this example is provide for illustrative purposes only, and is not intended to limit the present disclosure, as other examples may be equally applicable. For example, the crystallization speed of the phase change material 28 may be equal to 350 nanoseconds (ns), 300 nanoseconds (ns), 250 nanoseconds (ns), 200 nanoseconds (ns), 150 nanoseconds (ns), 100 nanoseconds (ns), 75 nanoseconds (ns), 50 nanoseconds (ns), as well as any range of values including one of the aforementioned examples as a lower limit to the range, and one of the aforementioned examples as an upper limit to the range. Further, the crystallization speed of the phase change material 28 may be equal to any value within the aforementioned ranges.

Figure 10:
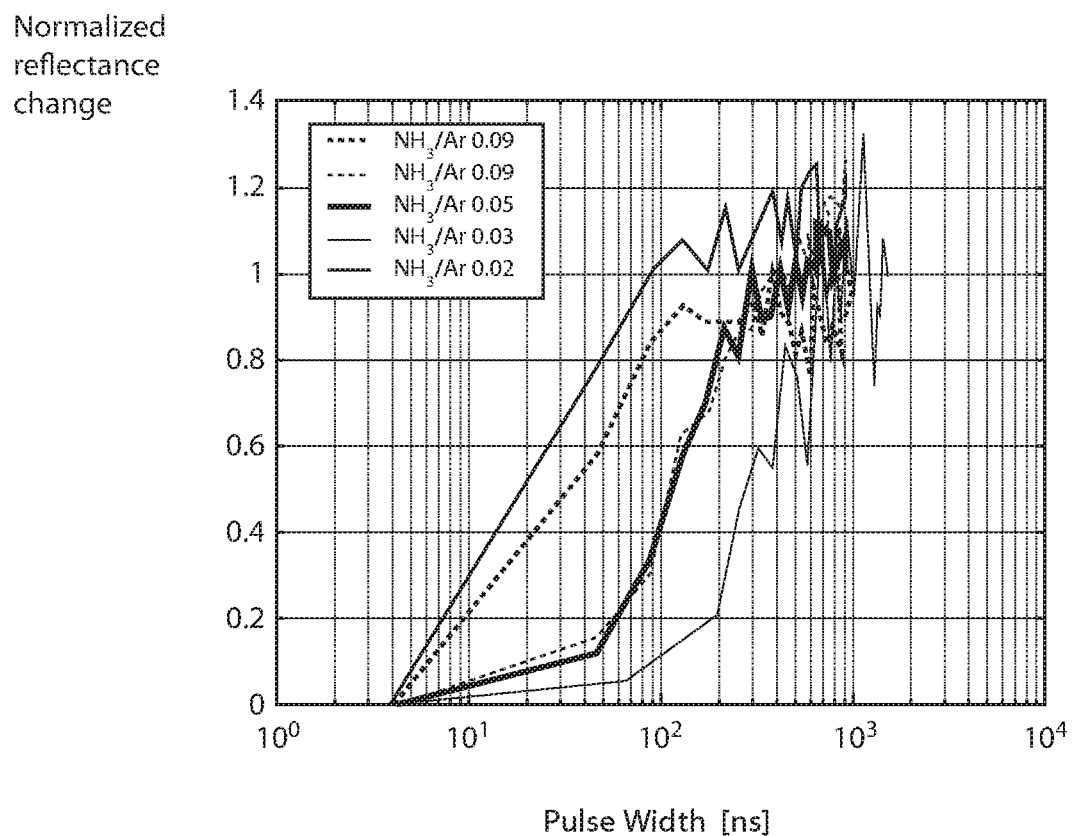
FIG. 10 is a plot illustrating switching speed as modified by adjusting the $NH_3/Ar$ flow.

FIG. 10 is a plot illustrating switching speed as modified by adjusting the $NH_3/Ar$ flow. As the ratio decreases, the crystallization speed improves. Some examples are as follows:

| NH3/Ar | Crystallization Speed [ns] |
|---|---|
| 0.090 | 330 |
| 0.053 | 210 |
| 0.034 | 125 |
| 0.020 | 85 |

Figure 11:
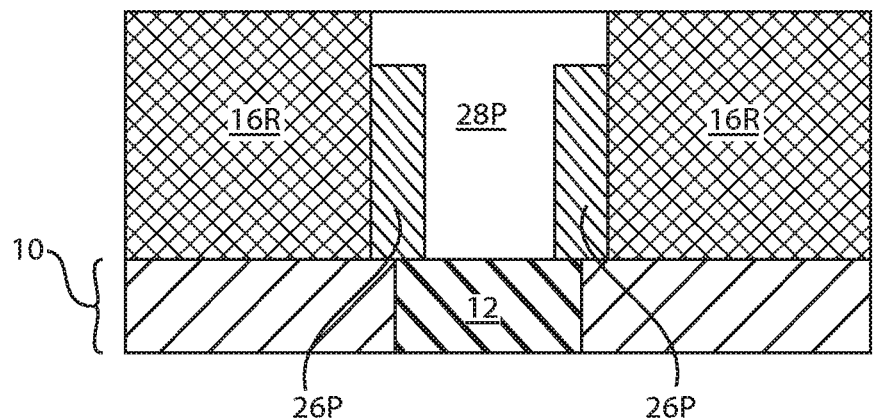
FIG. 11 is a cross sectional view of the exemplary semiconductor structure of FIG. 7 after removing an upper portion of the phase change material, remaining portions of the layer of third dielectric material and remaining portions of the layer of second dielectric material.

Referring now to FIG. 11, there is illustrated the exemplary semiconductor structure of FIG. 7 after removing an upper portion of the phase change material 28, remaining portions of the layer of third dielectric material (i.e., reduced length third dielectric material portions 20R) and remaining portions of the layer of second dielectric material (i.e., reduced length second dielectric material portions 18R). The structure shown in FIG. 8 can be formed utilizing a planarization process such as, for example, CMP and/or grinding. The phase change material 28 that remains within the via opening 22 after planarization is referred to herein as a phase change material structure 28P. As is shown, the topmost surface of the phase change material structure 28P is coplanar with the topmost surface of the remaining portions of the layer of first dielectric material (i.e., reduced length first dielectric material portions 16R). In this embodiment (and as shown), the phase change material structure 28P is T-shaped. In accordance with the present application, the phase change material structure 28P has portions that directly contact sidewall surfaces of the first dielectric material (i.e., 16R), portions that directly contact a topmost surface of each metal nitride spacer 26P, portions that contact sidewall surface of each metal nitride spacer 26P, and a bottommost surface the directly contacts the bottom electrode 12.

Figure 12A:
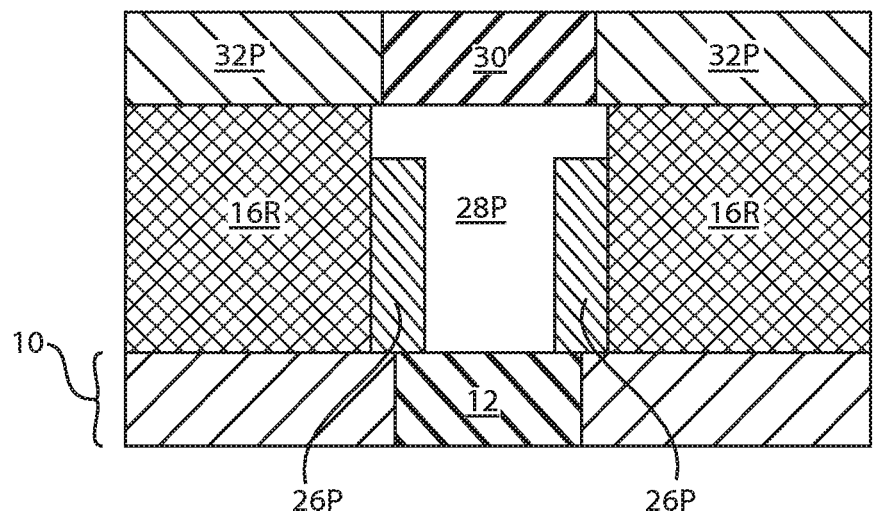
FIG. 12A is a cross sectional view of the exemplary semiconductor structure of FIG. 11 after forming a top electrode on a topmost surface of a phase change material structure.

Referring now to FIG. 12A, there is illustrated the exemplary semiconductor structure after forming a top electrode 30 on a topmost surface of the phase change material structure 28P. In some embodiments, the top electrode 30 can be embedded, i.e., housed, within top insulating substrate 32P. In some embodiments, the top insulating substrate 32P can be omitted.

The top electrode 30 may comprise one of the conductive metallic materials mentioned above in providing the bottom electrode 12. In some embodiments, the top electrode 18 and the bottom electrode 12 comprise a same conductive metallic material. In other embodiments, the top electrode 18 and the bottom electrode 12 comprise a different conductive metallic material. The top insulating substrate 32P may comprise one of the dielectric materials mentioned above for insulating substrate 10. In one embodiment, the top insulating substrate 32P and the insulating substrate 10 comprise a same dielectric material. In another embodiment, the top insulating substrate 32P and the insulating substrate 10 comprise a different dielectric material. The top electrode 30 and top insulating substrate 32P can be formed as described above in providing the structure shown in FIG. 1 of the present application.

Figure 8:
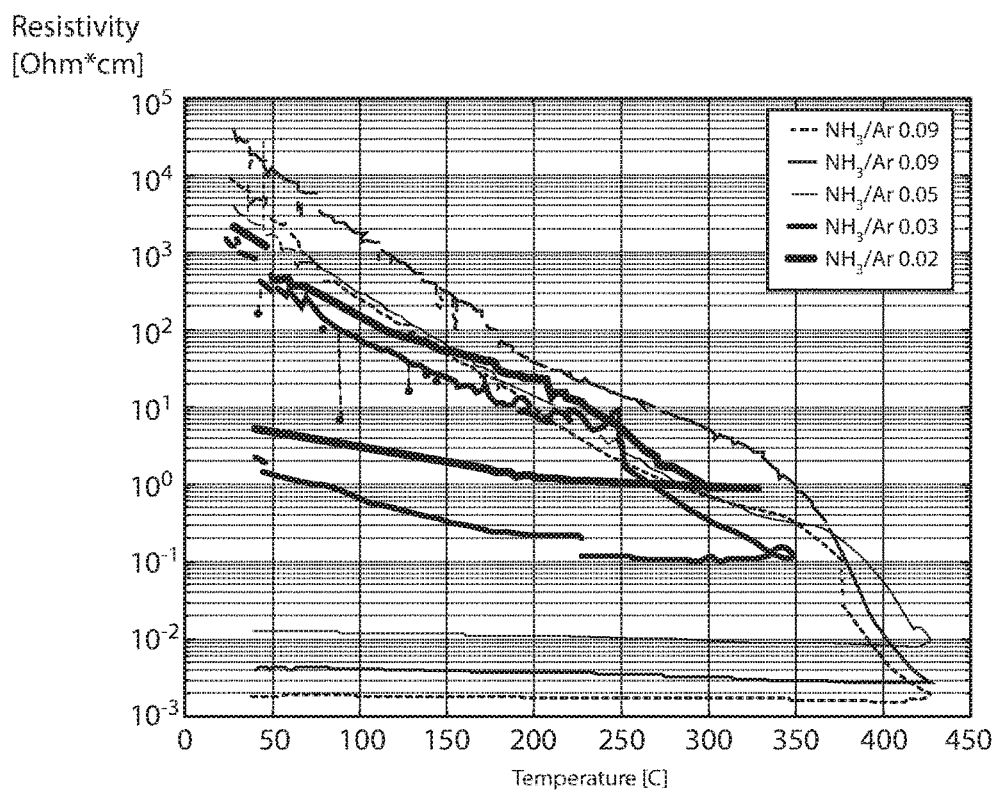
FIG. 8 is a plot of resistivity as a function of $NH_3/Ar$ flow for a plurality of phase change materials, in which with increased $NH_3$ flow there is an increase in nitrogen in the phase change material, a decrease in germanium and tellurium in the phase change material, and a decrease in crystalline resistance.
Figure 12B:
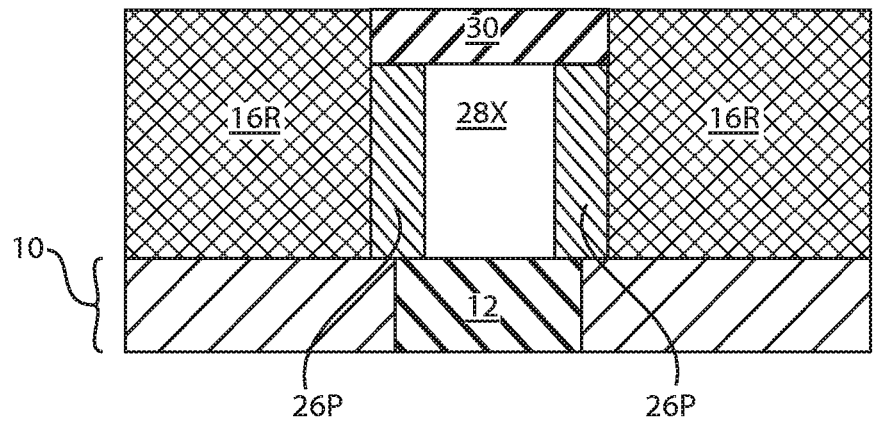
FIG. 12B is a cross sectional view of the exemplary semiconductor structure of FIG. 11 after recessing a top portion of the phase change material structure and forming a top electrode within the area previously occupied by the removed top portion of the phase change material structure.

Referring now to FIG. 12B, there is illustrated the exemplary semiconductor structure of FIG. 8 after recessing a top portion of the phase change material structure 28P and forming a top electrode 30 within the area previously occupied by the removed top portion of the phase change material structure 28P. The remaining phase change material structure 28P may be referred to herein as a reduced height phase change material structure 28X. The recessing of the top portion of the phase change material structure 28P may be performed utilizing an etch back process. The recessing exposes sidewalls of the remaining first dielectric material portions 16R as well as a topmost surface of each metal nitride spacer 26P. The top electrode 30 comprises one of materials mentioned above in providing the top electrode to the structure shown in FIG. 12A. Also, the top electrode 30 of this embodiment can be formed utilizing one of the deposition processes mentioned above and a planarization process may follow to provide the planarized structure shown in FIG. 12B. In this embodiment of the present application the phase change material structure is completely encases between bottom and top electrodes (12 and 30) and between metal nitride spacers 26P.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of composition control of chemical vapor deposition nitrogen doped germanium antimony tellurium, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of forming a phase change material comprising:
   providing a flow modulated chemical vapor deposition apparatus;
   flowing gas precursors into the flow modulated chemical vapor deposition apparatus to provide the base material components of the phase change material; and
   flowing a co-reactant precursor and an inert gas into the flow modulated chemical vapor deposition, wherein adjusting a ratio of the co-reactant precursor to the inert gas adjusts the crystalline state resistance of the phase change material, wherein a crystallization speed of the phase change material is between 330 nanoseconds (ns) and 85 nanoseconds (ns).

2. The method of claim 1, wherein the gas precursors that provide the base material components comprise a germanium (Ge) containing gas precursor, a tellurium (Te) containing gas precursor, and an antimony (Sb) containing gas precursor.

3. The method of claim 1, wherein the co-reactant precursor provides a nitrogen dopant in the phase change material.

4. The method of claim 3, wherein the co-reactant precursor is ammonia ($NH_3$).

5. The method of claim 1, wherein the phase change material comprises nitrogen (N) doped GeSbTe (GST).

6. The method of claim 5, wherein the nitrogen (N) doped GeSbTe (GST) comprises:
2 at. %<Ge<at. 10%;
30 at. %<Sb<at. 50%;
15 at. %<Te<at. 40%; and
10 at. %<N<at. 40%.

7. The method of claim 6, wherein a crystalline resistance of the phase change material is between 0.0041 Ohm·cm and 4.994 Ohm·cm.

8. A method of forming a phase change material comprising:
providing a flow modulated chemical vapor deposition apparatus;
flowing gas precursors into the flow modulated chemical vapor deposition apparatus to provide at least one of a germanium (Ge) content, antimony (Sb) content, and tellurium (Te) content of the phase change material; and
flowing a co-reactant precursor of ammonia ($NH_3$) and an inert gas of argon (Ar) into the flow modulated chemical vapor deposition, wherein adjusting a ratio of the co-reactant precursor to the inert gas adjusts the crystalline state resistance of the phase change material, wherein a crystalline resistance of the phase change material is between 0.0041 Ohm·cm and 4.994 Ohm·cm, and a crystallization speed of the phase change material is between 330 nanoseconds (ns) and 85 nanoseconds (ns).

9. The method of claim 8, wherein the phase change material comprises nitrogen (N) doped GeSbTe (GST).

10. The method of claim 9, wherein the nitrogen (N) doped GeSbTe (GST) comprises:
2 at. %<Ge<at. 10%;
30 at. %<Sb<at. 50%;
15 at. %<Te<at. 40%; and
10 at. %<N<at. 40%.

11. A method of forming a phase change memory device comprising:
forming a lower electrode;
forming a phase change material on the lower electrode using a flow modulated chemical vapor deposition apparatus, the forming the phase change material comprises flowing gas precursors into the flow modulated chemical vapor deposition apparatus to provide the base material components of the phase change material, and flowing a co-reactant precursor of ammonia ($NH_3$) and an inert gas into the flow modulated chemical vapor deposition, wherein adjusting a ratio of the co-reactant precursor to the inert gas adjusts the crystalline state resistance of the phase change material to provide a reset current and set speed for the phase change memory device; and
forming an upper electrode on the upper surface of the phase change material.

12. The method of claim 11, wherein the gas precursors that provide the base material components comprise a germanium (Ge) containing gas precursor, a tellurium (Te) containing gas precursor, and an antimony (Sb) containing gas precursor.

13. The method of claim 11, wherein the co-reactant precursor provides a nitrogen dopant in the phase change material.

14. The method of claim 11, wherein the phase change material comprises nitrogen (N) doped GeSbTe (GST).

15. The method of claim 14, wherein the nitrogen (N) doped GeSbTe (GST) comprises:
2 at. %<Ge<at. 10%;
30 at. %<Sb<at. 50%;
15 at. %<Te<at. 40%; and
10 at. %<N<at. 40%.

16. The method of claim 15, wherein a crystalline resistance of the phase change material is between 0.0041 Ohm·cm and 4.994 Ohm·cm, and a crystallization speed of the phase change material is between 330 nanoseconds (ns) and 85 nanoseconds (ns).

* * * * *